(12) United States Patent
Jackson et al.

(10) Patent No.: US 8,035,370 B2
(45) Date of Patent: Oct. 11, 2011

(54) SYSTEMS AND METHODS TO STIR AN ELECTROMAGNETIC (EM) FIELD

(75) Inventors: Daniel P. Jackson, Issaquah, WA (US); Dennis M. Lewis, Lynnwood, WA (US); Jason A. Koehn, Enumclaw, WA (US); Dennis A. Russell, Edmonds, WA (US)

(73) Assignee: The Boeing Company, Chicago, IL (US)

( * ) Notice: Subject to any disclaimer, the term of this patent is extended or adjusted under 35 U.S.C. 154(b) by 396 days.

(21) Appl. No.: 12/401,479

(22) Filed: Mar. 10, 2009

(65) Prior Publication Data
US 2010/0231232 A1    Sep. 16, 2010

(51) Int. Cl.
*G01R 1/20*    (2006.01)
*G01R 31/308*    (2006.01)

(52) U.S. Cl. .................................. 324/144; 324/750.12
(58) Field of Classification Search .................. 324/537, 324/500, 228, 262, 750.12, 754.29, 144, 324/76.11, 313, 463, 627, 637
See application file for complete search history.

(56) References Cited

U.S. PATENT DOCUMENTS

| | | | |
|---|---|---|---|
| 5,327,091 A | | 7/1994 | Loughry |
| 5,384,618 A | * | 1/1995 | Schurman et al. ............. 355/32 |
| 5,522,934 A | * | 6/1996 | Suzuki et al. .......... 118/723 AN |
| 5,530,412 A | | 6/1996 | Goldblum |
| 6,795,030 B2 | | 9/2004 | Klingler et al. |
| 6,885,265 B2 | | 4/2005 | Li et al. |
| 7,105,787 B2 | | 9/2006 | Clemen, Jr. |
| 7,554,339 B2 | * | 6/2009 | Horton et al. ................. 324/627 |
| 2002/0160717 A1 | | 10/2002 | Persson et al. |
| 2007/0110208 A1 | * | 5/2007 | Molina-Martinez .......... 376/100 |
| 2010/0014571 A1 | * | 1/2010 | Horton et al. ................. 375/227 |
| 2010/0099361 A1 | * | 4/2010 | Lundstrom et al. ........ 455/67.11 |

FOREIGN PATENT DOCUMENTS

WO    WO 2008127158    10/2008

OTHER PUBLICATIONS

European Search Report, EP Application No. 10250395.0, European Patent Office, Jun. 17, 2010, (4 pgs).

* cited by examiner

*Primary Examiner* — Hoai-An D Nguyen
(74) *Attorney, Agent, or Firm* — Toler Law Group

(57) ABSTRACT

Systems and methods to stir an electromagnetic (EM) field of an EM reverberation chamber are disclosed. A particular system includes an EM reverberation chamber. The system also includes a transmit antenna and a receive antenna operable to generate an EM field within the EM reverberation chamber. The system further includes a variable charged particle source to stir the EM field by varying introduction of charged particles into the EM field.

20 Claims, 6 Drawing Sheets

US 8,035,370 B2

SYSTEMS AND METHODS TO STIR AN ELECTROMAGNETIC (EM) FIELD

FIELD OF THE DISCLOSURE

The present disclosure is generally related to stirring an electromagnetic (EM) field.

BACKGROUND

Electromagnetic (EM) reverberation chambers are used to perform various tests on devices. For certain tests, an EM reverberation chamber subjects a device under test to an EM field. The EM reverberation chamber may include a stirring device to stir the EM field. For example, the EM reverberation chamber may include a movable metal paddle that is moved to stir the EM field.

SUMMARY

Systems and methods to stir an electromagnetic (EM) field of an EM reverberation chamber are disclosed. In a particular embodiment, a system includes an EM reverberation chamber. The system also includes a transmit antenna and a receive antenna operable to generate an EM field within the EM reverberation chamber. The system further includes a variable charged particle source to stir the EM field by varying the introduction of charged particles into the EM field.

In another particular embodiment, a method includes generating an electromagnetic (EM) field in an EM reverberation chamber. The method also includes introducing a plurality of charged particles into the EM reverberation chamber. The method further includes stirring the EM field by varying the plurality of charged particles introduced into the EM reverberation chamber.

DETAILED DESCRIPTION

The features, functions, and advantages that are discussed can be achieved independently in various embodiments disclosed herein or may be combined in yet other embodiments further details of which can be shown with reference to the following description and drawings.

Particular systems and methods described below can be used to stir electromagnetic (EM) fields in EM reverberation chambers. In particular, the systems and methods enable stirring of the EM fields without the use of mechanical stirring devices, such as moveable metal paddles. Avoiding the use of mechanical stirring devices may reduce the cost of the EM reverberation chambers. Additionally, since mechanical stirring devices may be large and may be placed within the EM reverberation chamber, eliminating the mechanical stirring devices may allow more of the EM reverberation chamber to be used or may allow smaller EM reverberation chambers to be used.

Further, particular moveable metal paddles may be designed and placed within the EM reverberation chamber to stir EM fields that have certain characteristics. When the EM field characteristics are changed, the moveable metal paddles may be moved. For example, a step motor may be used to adjust a position of the moveable metal paddle. Such step motors can be expensive. Additionally, when a step motor is used a settling time may be required after moving the moveable metal paddles to allow vibrations and oscillations of the moveable metal parts to settle before testing is performed. However, the systems and methods described herein enable stirring of EM fields having different characteristics without changing out or relocating equipment, such as moveable metal paddles.

Figure 1:
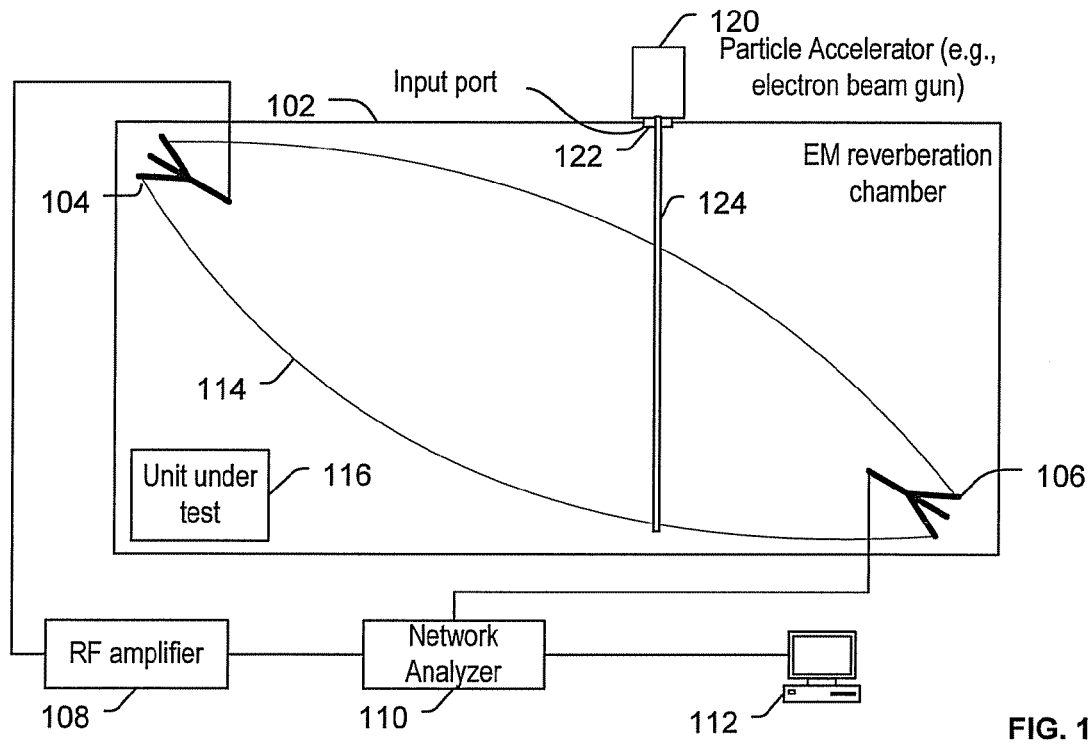
FIG. 1 is a diagram of a first particular embodiment of a system to stir an electromagnetic (EM) field of an EM reverberation chamber.

FIG. 1 is a diagram of a first particular embodiment of a system to stir an electromagnetic (EM) field of an EM reverberation chamber. The system includes an EM reverberation chamber 102 having a plurality of antennas, such as a transmit antenna 104 and a receive antenna 106, that may be driven by a radio frequency (RF) amplifier 108 to generate an electromagnetic field 114.

In a particular embodiment, the antennas 104, 106 may be coupled to a network analyzer 110. The network analyzer 110 is responsive to the transmit antenna 104 and the receive antenna 106 to take readings of the EM field 114 within the EM reverberation chamber 102. The network analyzer 110 may be coupled to a computing device 112 that includes a processor capable of analyzing the EM field 114 readings to determine particular information about the EM field 114. For example, the computing device 112 may determine whether a desired level of stirring of the EM field 114 has been achieved. For example, the computing device 112 may perform statistical analysis of the readings taken by the network analyzer 110 to determine when the EM field 114 is stirred and when the stirring level reaches a desired level.

Stirring the EM field 114 refers to varying the distribution of the EM field 114 within the EM reverberation chamber 102. For example, in a first type of operation, the EM field 114 may be stirred while readings of the EM field 114 are taken. This type of operation is sometimes referred to as "mode stirring" or "mode stirred operation". In another example, in a second type of operation, the EM field 114 may be stirred between taking readings at different input conditions (e.g., different frequencies or polarizations of the EM field 114). The second type of operation is sometimes referred to as "mode tuning" or "mode tuned operation". In either type of operation, the EM field 114 may be stirred to average out the distribution of the EM field 114 within the EM reverberation chamber 102 over a number of readings.

During operation of the EM reverberation chamber 102, the network analyzer 110 and the computing device 112 may determine an effect of the EM field 114 on a unit under test 116. By stirring the EM field 114 while testing the unit under test 116, an understanding of how various EM field conditions affect the unit under test 116 can be determined. For example, the unit under test 116 may be tested for EM susceptibility at various EM field conditions, such as field strengths, frequencies, polarizations, or any combination thereof.

In a particular embodiment, the EM reverberation chamber 102 includes an input port 122. The input port 122 is adapted to allow introductions of a plurality of charged particles into the EM reverberation chamber 102. For example, the charged particles may be generated by a variable charged particle source, such as a particle accelerator 120 (e.g., an electron beam gun, a linear accelerator, an ion beam gun, or another particle beam accelerator). The particle accelerator 120 may project the plurality of charged particles as a charged particle beam 124 into the EM reverberation chamber 102. In a particular embodiment, the presence of the charged particle beam 124 in the EM reverberation chamber 102 changes the distribution of the EM field 114 within the EM reverberation chamber 102. For example, when sufficient charged particles are present, the charged particle beam 124 may act as a conductive surface within the EM reverberation chamber. The charged particle beam 124 may modify the EM field 114 in a manner similar to introducing a conductor or conductive surface to the EM reverberation chamber 102. In a particular embodiment, by changing the charged particle beam 124, modes of the EM field 114 within the EM reverberation chamber 102 can be changed enabling mode stirring operation or mode tuning operation of the EM reverberation chamber. The mode stirring or mode tuning may be used to test the effects of the EM field 114 on the unit under test 116.

Figure 2:
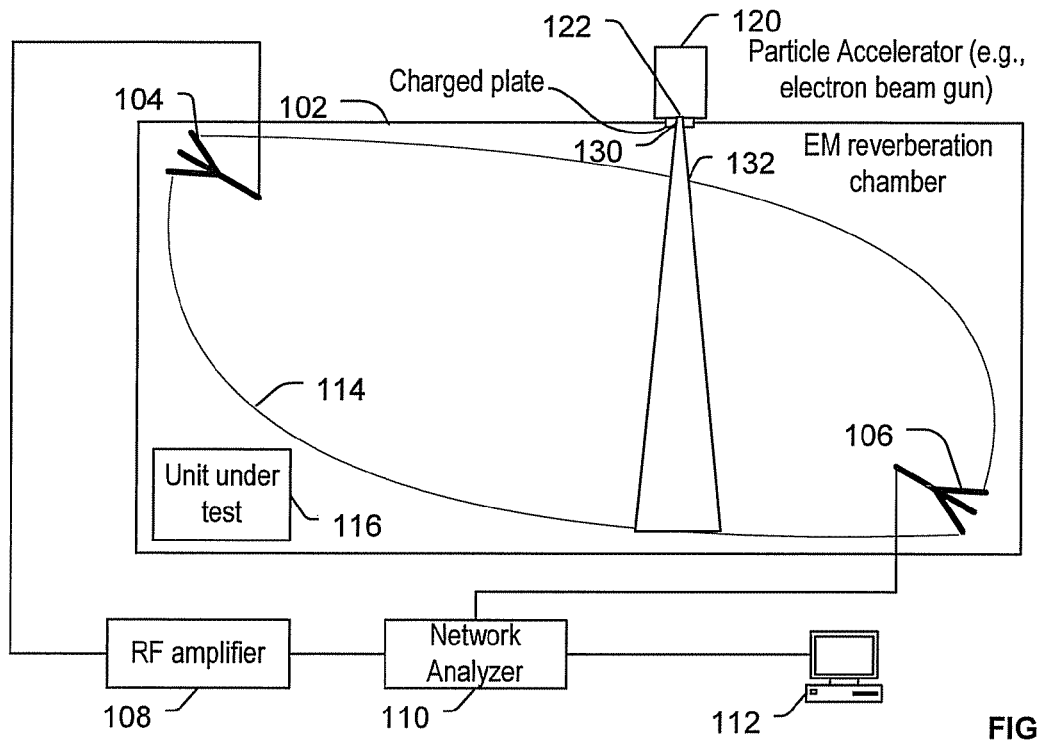
FIG. 2 is a diagram of a second particular embodiment of a system to stir an EM field of an EM reverberation chamber.

FIG. 2 is a diagram of a second particular embodiment of a system to stir an electromagnetic (EM) field of an EM reverberation chamber. In a particular embodiment, the system illustrated in FIG. 2 can include many of the same or similar features as were discussed with reference to FIG. 1. Accordingly, to simplify the description of FIG. 2, features that may be the same or similar between the system illustrated in FIG. 1 and the system illustrated in FIG. 2 have been given the same reference numeral. For example, in FIG. 2, the system includes the reverberation chamber 102 with the transmit antenna 104 and the receive antenna 106 coupled to the radio frequency (RF) amplifier 108 to generated the EM field 114. Additionally, the system includes the network analyzer 110 and the computing device 112 to sample and analyze the EM field 114 and the effects of the EM field 114 on the unit under test 116.

In the system illustrated in FIG. 2, the input port 122 includes or is in proximity to a charged plate 130. The charged plate 130 may include an opening through which a charged particle beam 132 may be introduced into the EM reverberation chamber 102. For example, the charged particle beam 132 may be projected from the particle accelerator 120 through or near the charged plate 130. In a particular embodiment, when a charge is applied to the charged plate 130, the charge modifies the charged particle beam 132 as a result of charged particles of the charged particle beam 132 being attracted to or repelled by the charge. The charged plate 130 may be used to change a distribution of the charged particles within the EM reverberation chamber 102. For example, the charged plate may be used to change a focus or a direction of the charged particle beam 132. To illustrate, the charged particle beam 132 may be spread to a broader focus region or narrowed to a finer focus region thereby changing the distribution of the charged particles of the charged particle beam 132 within the EM reverberation chamber 102.

By changing a charge applied to the charged plate 130, the charged particle beam 132 may be controlled to stir the EM field 114 within the EM reverberation chamber 102. For example, before the charge is applied to the charged plate 130, the beam may be a substantially straight and narrowly focused beam, such as the relatively narrow, focused charged particle beam 124 illustrated in FIG. 1. However, after the charge is applied to the charged plate 130, the beam may be spread out, or less focused, such as the relatively broad, less focused charged particle beam 132 illustrated in FIG. 2. Alternatively or additionally, the charged plate 130 may be used to change a direction of the charged particle beam 132 within the EM reverberation chamber 102. Changing the direction of the charged particle beam 132 within the EM reverberation chamber 102 changes the distribution of charged particles in the EM reverberation chamber and may result in stirring of the EM field 114.

Figure 3:
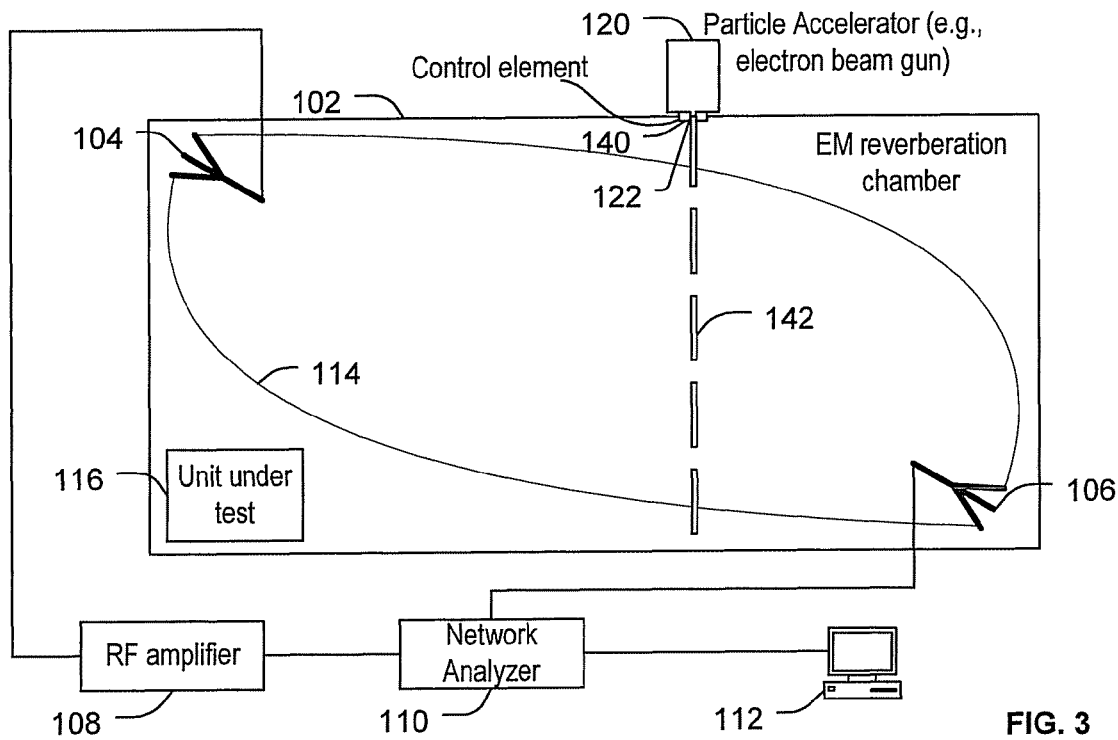
FIG. 3 is a diagram of a third particular embodiment of a system to stir an EM field of an EM reverberation chamber.

FIG. 3 is a diagram of a third particular embodiment of a system to stir an EM field of an EM reverberation chamber. In a particular embodiment, the system illustrated in FIG. 3 can include many of the same or similar features as were discussed with reference to FIGS. 1 and 2. Accordingly, to simplify the discussion of FIG. 3, features that may be the same or similar between the system illustrated in FIG. 3 and the system illustrated in FIG. 1 or the system illustrated in FIG. 2 have been given the same reference numeral. For example, in FIG. 3, the system includes the reverberation chamber 102 with the transmit antenna 104 and the receive antenna 106 coupled to the radio frequency (RF) amplifier 108 to generated the EM field 114. Additionally, the system includes the network analyzer 110 and the computing device 112 to sample and analyze the EM field 114 and the effects of the EM field 114 on the unit under test 116.

In the system illustrated in FIG. 3, the EM reverberation chamber 102 includes the input port 122 that includes or is in proximity to a control element 140. The control element 140 enables variable introduction of a plurality of charged particles into the EM reverberation chamber 102 from the particle accelerator 120. For example, the control element 140 may turn the particle accelerator 120 on and off to generate a pulsed charged particle beam 142. The cycle or timing of the pulses may be modified to change an effect of the charged particles on the EM field 114 in order to stir the EM field 114. In another example, the control element 140 may include a shutter or other similar device that blocks or inhibits charged particles from the particle accelerator 120 from being introduced into the EM reverberation chamber 102. More specifically, the particle accelerator 120 and the control element 140 may together form a variable charge particle source.

Figure 4:
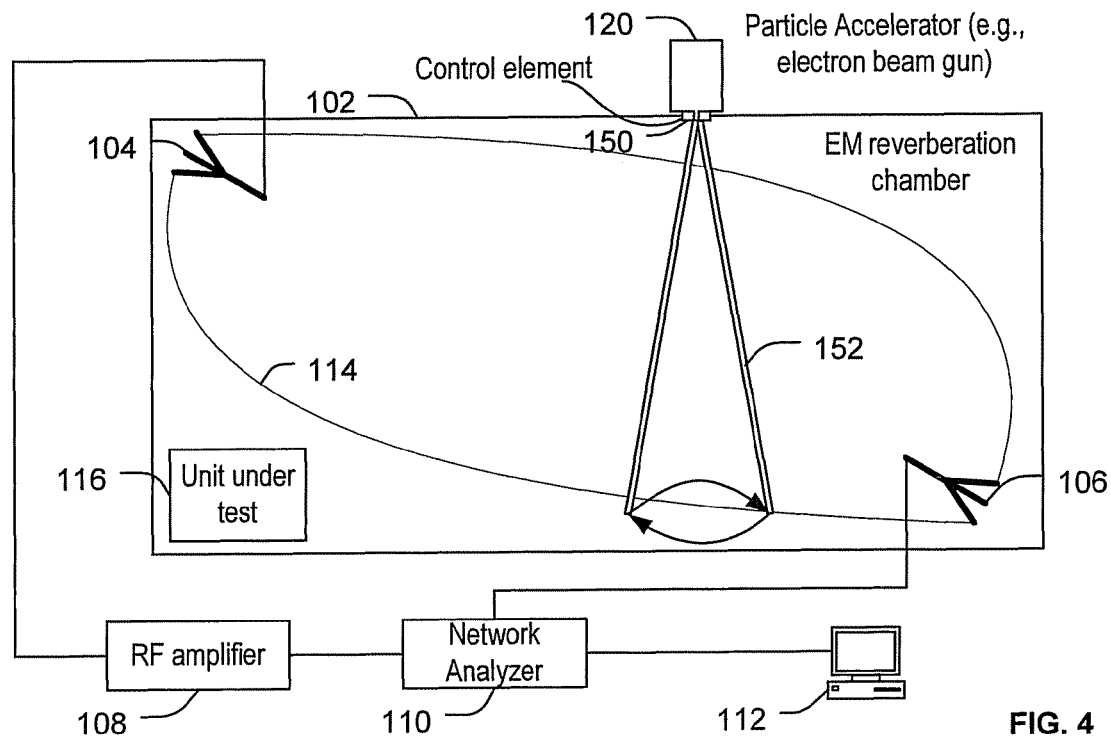
FIG. 4 is a diagram of a fourth particular embodiment of a system to stir an EM field of an EM reverberation chamber.

FIG. 4 is a diagram of a fourth particular embodiment of a system to stir an EM field of an EM reverberation chamber. In a particular embodiment, the system illustrated in FIG. 4 can include many of the same or similar features as discussed with reference to FIG. 1, FIG. 2, or FIG. 3. Accordingly, to simplify the discussion of FIG. 4, certain features have been given the same reference numeral when those features may be the same or similar between the system illustrated in FIG. 4 and the system illustrated in FIG. 1, the system illustrated in FIG. 2, or the system illustrated in FIG. 3. For example, in FIG. 4, the system includes the reverberation chamber 102 with the transmit antenna 104 and the receive antenna 106 coupled to the radio frequency (RF) amplifier 108 to generated the EM field 114. Additionally, the system includes the network analyzer 110 and the computing device 112 to sample and analyze the EM field 114 and the effects of the EM field 114 on the unit under test 116.

In the system illustrated in FIG. 4, the EM reverberation chamber 102 includes a control element 150. The control element 150 controls the introduction of a charged particle beam 152 into the EM reverberation chamber 102 from a charged particle source, such as the particle accelerator 120. In a particular embodiment, the control element 150 is adapted to change an angle of the charged particle beam 152 introduced into the EM reverberation chamber 102. To illustrate, the charged particle beam 152 may be directed around an interior of the EM reverberation chamber 102 in a pattern or in a random or pseudo-random manner. In a particular illustrative embodiment, the control element 150 includes one or more charged plates that are adapted to steer the charged particle beam 152. In other embodiments, the control element 150 includes other devices or apparatus adapted to change the direction of the charged particle beam 152. Changing the direction of the charged particle beam 152 may change a distribution of the charged particles within the EM reverberation chamber 102. Therefore, by changing the direction of the charged particle beam 152 introduced into the EM reverberation chamber 102, the EM field 114 may be stirred, for example, to enable testing of the unit under test 116.

In a particular embodiment, the computing device 112 and the network analyzer 110 may interact to stir the EM field 114. For example, the network analyzer 110 may take baseline readings of the EM field 114 before the charged particles are introduced into the EM reverberation chamber 102 (e.g., as illustrated in FIG. 1). Subsequently, the charged particles may be introduced into the EM reverberation chamber 102 (e.g., as illustrated in FIGS. 2-4). The network analyzer 110 may then take a second set of sample readings of the EM field 114. The computing device 112 may analyze the baseline readings and the second set of sample readings of the EM field 114 to determine whether the EM field 114 is effectively stirred. When the computing device 112 determines that the EM field 114 is not effectively stirred, a characteristic of the charged particles introduced into the EM reverberation chamber 102 may be changed to achieve stirring of the EM field 114. In an illustrative embodiment, the computing device 110 alternately (e.g., iteratively) performs a statistical analysis of the readings taken by the network analyzer 110 and varies the charged particles introduced into the EM reverberation chamber 102 until the statistical analysis indicates that the EM field 114 is stirred.

Figure 5:
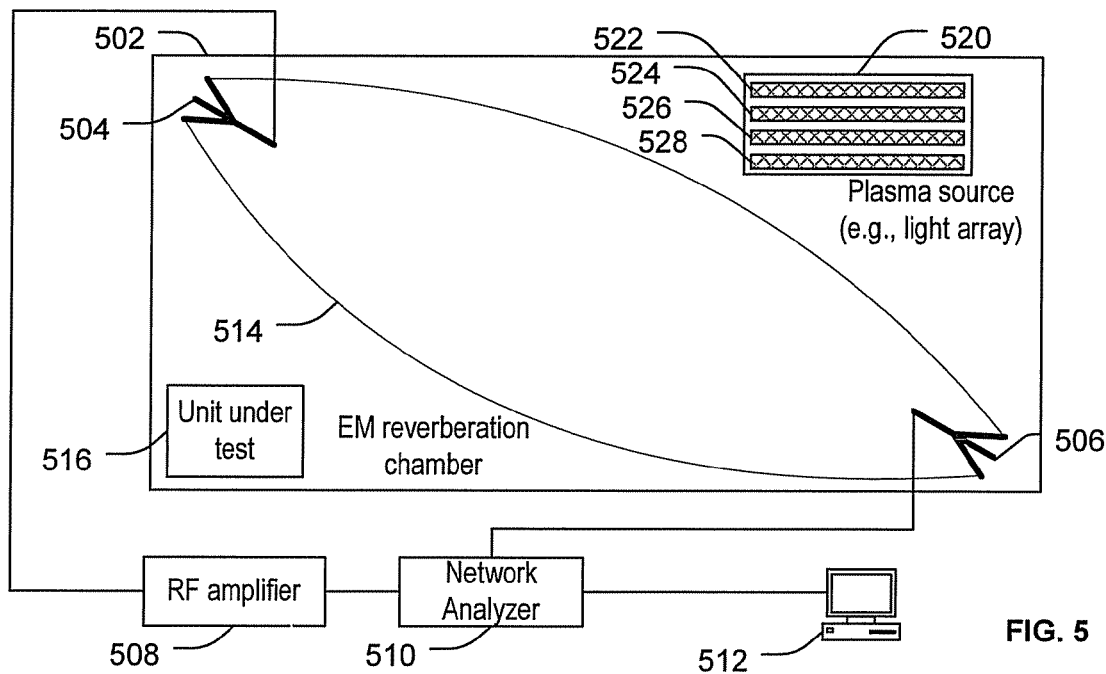
FIG. 5 is a diagram of a fifth particular embodiment of a system to stir an EM field of an EM reverberation chamber.

FIG. 5 is a diagram of a fifth particular embodiment of a system to stir an EM field of an EM reverberation chamber. The system includes an electromagnetic reverberation chamber 502 having a transmit antenna 504 and a receive antenna 506. The transmit antenna 504, the receive antenna 506, or both, may be coupled to a radio frequency (RF) amplifier 508. The antenna 504, 506 are also coupled to a network analyzer 510. The network analyzer 510 is adapted to take readings of an EM field 514 between the transmit antenna 504 and the receive antenna 506. The network analyzer 510 may also be coupled to a computing device 512. The computing device 512 may include a processor and may be adapted to analyze the readings taken by the network analyzer 510 to determine statistical information regarding the EM field 514, the effect of the EM field 514 on a unit under test 516, or both.

In a particular embodiment, the EM reverberation chamber 502 includes a variable charged particle source. For example, the variable charged particle source may include a plasma source 520. In an illustrative embodiment, the plasma source 520 includes a light array, such as a plurality of florescent lights. For example, the plasma source 520 may include a first florescent light 522, a second florescent light 524, a third florescent light 526 and a fourth florescent light 528. Each florescent light 522-528 is adapted to generate a plasma within the EM reverberation chamber 502. The plasma generated by the florescent lights 522-528 may act as a conductive surface that modifies the EM field 514 within the EM reverberation chamber 502.

Figure 6:
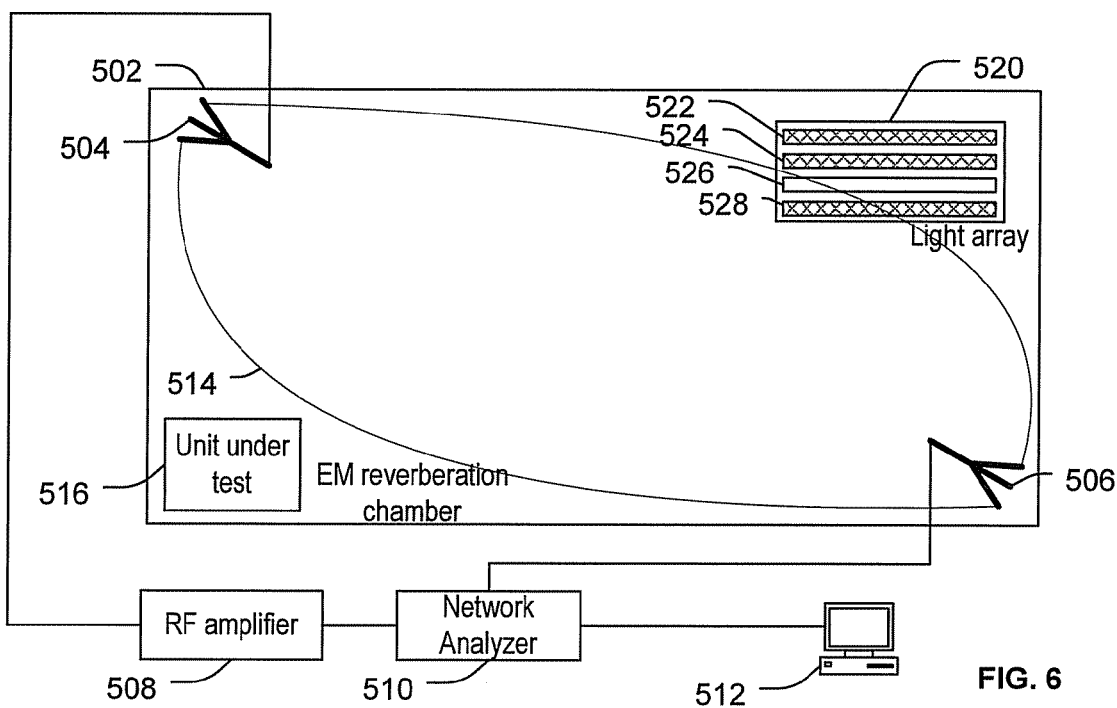
FIG. 6 is a diagram of a sixth particular embodiment of a system to stir an EM field of an EM reverberation chamber.

The plasma source 520 may vary the charged particles introduced into the EM reverberation chamber 502 by changing which florescent lights 522-528 are powered, an amount of power applied to one or more of the florescent lights 522-528, or both. For example, as illustrated in FIG. 5, the florescent lights 522-528 are shown as off as indicated by an "x" pattern within the florescent lights 522-528. However, as illustrated in FIG. 6, the third florescent light 526 is on. Turning on the third florescent light 526 changes the distribution of charged particles within the EM reverberation chamber 502 resulting in a change in the distribution of the EM field 514 within the EM reverberation chamber 502.

In a particular embodiment, the computing device 512 may control the plasma source 520 to change power provided to the florescent lights 522-528, to change which florescent lights 522-528 are turned on, to change other characteristics of the florescent lights 522-528, or any combination thereof. For example, the plurality of florescent lights 522-528 of the plasma source 520 may be powered in different patterns. Thus, the computing device 512 can vary the introduction of the charged particles into the EM reverberation chamber 502 from the plasma source 520 to change the EM field 514 without the use of any mechanical apparatus (such as a mechanical stirring device).

In a particular embodiment, the computing device 512 and the network analyzer 510 may interact to stir the EM field 514. For example, the network analyzer 510 may take baseline readings of the EM field 514 without any of the florescent lights on (as illustrated in FIG. 5). Subsequently, one or more of the florescent lights 522-528 may be turned on. For example, the third florescent light 526 may be turned on (as illustrated in FIG. 6). The network analyzer 510 may then take a second set of sample readings of the EM field 514. The computing device 512 may analyze the baseline readings and the second set of sample readings of the EM field 514 to determine whether the EM field 514 is effectively stirred. When the computing device 512 determines that the EM field 514 is not effectively stirred, the plasma source 520 may be varied, for example, by turning on one or more additional florescent lights 522-528, such as the first florescent light 522. Alternately, a characteristic of the third florescent light 526 may be changed. For example, the amount of power supplied to the third florescent light 526 may be increased or decreased, or a frequency of the power applied to the third florescent light 526 may be changed. In an illustrative embodiment, the computing device 510 alternately performs a statistical analysis of the readings taken by the network analyzer 510 and controls the plasma source 520 to vary the charged particles introduced into the EM reverberation chamber 502 (e.g., by changing a characteristic of at least one florescent light 522-528) until the statistical analysis indicates that the EM field 514 is stirred. In this manner, various distributions of charged particles may be introduced into the EM reverberation chamber 502. For example, different patterns of the florescent lights 522-528 may be powered and various power levels or other power characteristics may be provided to the florescent lights 522-528.

Figure 7:
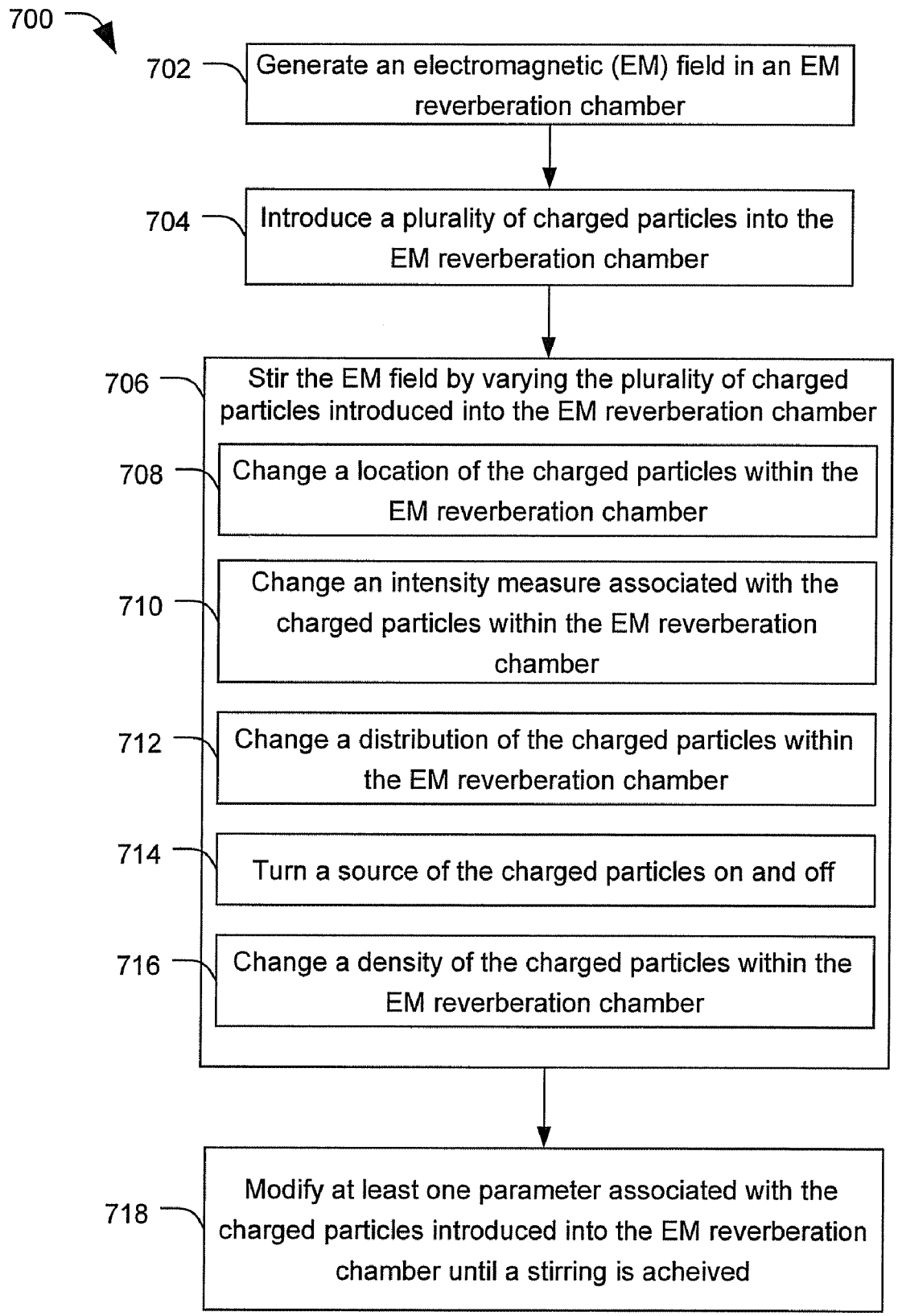
FIG. 7 is a flow diagram of a first particular embodiment of a method of stirring an EM field of an EM reverberation chamber.

FIG. 7 is a flow diagram of a first particular embodiment of a method of stirring an EM field of an EM reverberation chamber. The method 700 may include, at 702, generating an electromagnetic (EM) field in an EM reverberation chamber. For example, the EM reverberation chamber may include the EM reverberation chamber 102 discussed with reference to FIGS. 1-4 or the EM reverberation chamber 502 discussed with reference to FIGS. 5 and 6. The method 700 may also include, at 704, introducing a plurality of charged particles into the EM reverberation chamber.

Introducing the plurality of charged particles into the EM reverberation chamber at 704 may cause stirring; however, in a particular embodiment, the method 700 also includes stirring the EM field by varying the plurality of charged particles introduced in the EM reverberation chamber, at 706. For example, the plurality of charged particles introduced into the EM reverberation chamber may be varied by changing, at 708, a location of the charged particles within the EM reverberation chamber. To illustrate, a direction of a charged particle beam may be modified by using a beam steering mechanism (such as a charged plate) to change an angle or distribution of the charged particle beam introduced into the EM reverberation chamber. In another illustrative example of changing a location of the charged particles, different lights of a variable light array may be powered to change a location or a distribution of a plasma introduced into the EM reverberation chamber. In yet another illustrative example, a focus of a charged particle beam introduced into the EM reverberation chamber may be changed using a shutter or another beam focusing mechanism (such as a charged plate).

In a particular embodiment, the plurality of charged particles introduced into the EM reverberation chamber may be changed, at 710, by changing an intensity measure associated with the charged particles introduced into the EM reverberation chamber. To illustrate, the intensity measure may be associated with a power level of a charged particle beam or plasma introduced into the EM reverberation chamber. For example, a power level supplied to a florescent light array that generates plasma within the EM reverberation chamber may be modified to change the intensity measure. In another example, an intensity of a charged particle beam generated by a particle beam gun may be modified to change the intensity measure.

The charged particles introduced into the EM reverberation chamber may be varied, at 712, by changing a distribution of the charged particles within the EM reverberation chamber. For example, the distribution of the charged particles of the EM reverberation chamber may be modified by changing the focus of a charged particle beam introduced into the EM reverberation chamber. In another example, the distribution of charged particle in the EM reverberation chamber may be modified by changing a direction or angle at which the charged particle beam is introduced into the EM reverberation chamber. In yet another example, the distribution of charged particles within the EM reverberation chamber may be modified by changing an intensity of the charged particle beam or cycling the charged particle beam on and off. In yet another example, the distribution of charged particles within the EM reverberation chamber may be modified using a plasma source by changing a pattern of plasma sources that are powered within the EM reverberation chamber or by changing a power level of one or more of the plasma sources.

In a particular embodiment, the plurality of charged particles introduced into the EM reverberation chamber may be varied, at 714, by turning a source of the charged particles on or off. For example, where a plasma source is used a plurality of florescent lights may be powered on or off individually, or as a group, to change the charged particles within the EM reverberation chamber. In another example, a particle accelerator, such as an electron beam gun, may be turned on or off occasionally, periodically, or according to a particular pattern in order to stop and start the introduction of charged particles into the EM reverberation chamber.

In another particular embodiment, the plurality of charged particles introduced into the EM reverberation chamber may be varied, at 716, by changing a density of the charged particles within the EM reverberation chamber. In an illustrative embodiment, the density of the charged particles associated with a plasma may be related to power applied to the plasma source, may be related to a number of plasma sources powered within the EM reverberation chamber, or both. For example, where the plasma source includes florescent light bulbs, the power applied to each florescent light bulb may be modified to change the density of the charged particles in the EM reverberation chamber, or the number of florescent light bulbs that are powered may be changed to change the density of the charged particles within the EM reverberation chamber. In another example, the intensity of a charged particle beam generated by a particle accelerator may be modified to change the density of the charged particles in the EM reverberation chamber.

In a particular embodiment, the method includes, at 718, modifying at least one parameter associated with the charged particles introduced into the EM reverberation chamber until stirring is achieved. For example, a statistical correlation may be determined with respect to baseline readings taken before the charged particles are introduced into the EM reverberation chamber and one or more sample readings taken after the charged particles are introduced into the EM reverberation chamber. When there is a statistical correlation between the baseline readings and the one or more sample readings (e.g., when a correlation value related to the baseline readings and the sample readings satisfies a predetermined threshold), the EM field may be determined to not be stirred. However, when there is no statistical correlation between the baseline readings and the one or more sample readings (e.g., when the correlation value related to the baseline readings and the sample readings does not satisfy the predetermined threshold), the EM field may be determined to be stirred. When stirring is not achieved, the charged particles introduced into the EM reverberation chamber may be varied and another statistical correlation may be determined. Thus, the method may continue iteratively in this manner until stirring is achieved.

Figure 8:
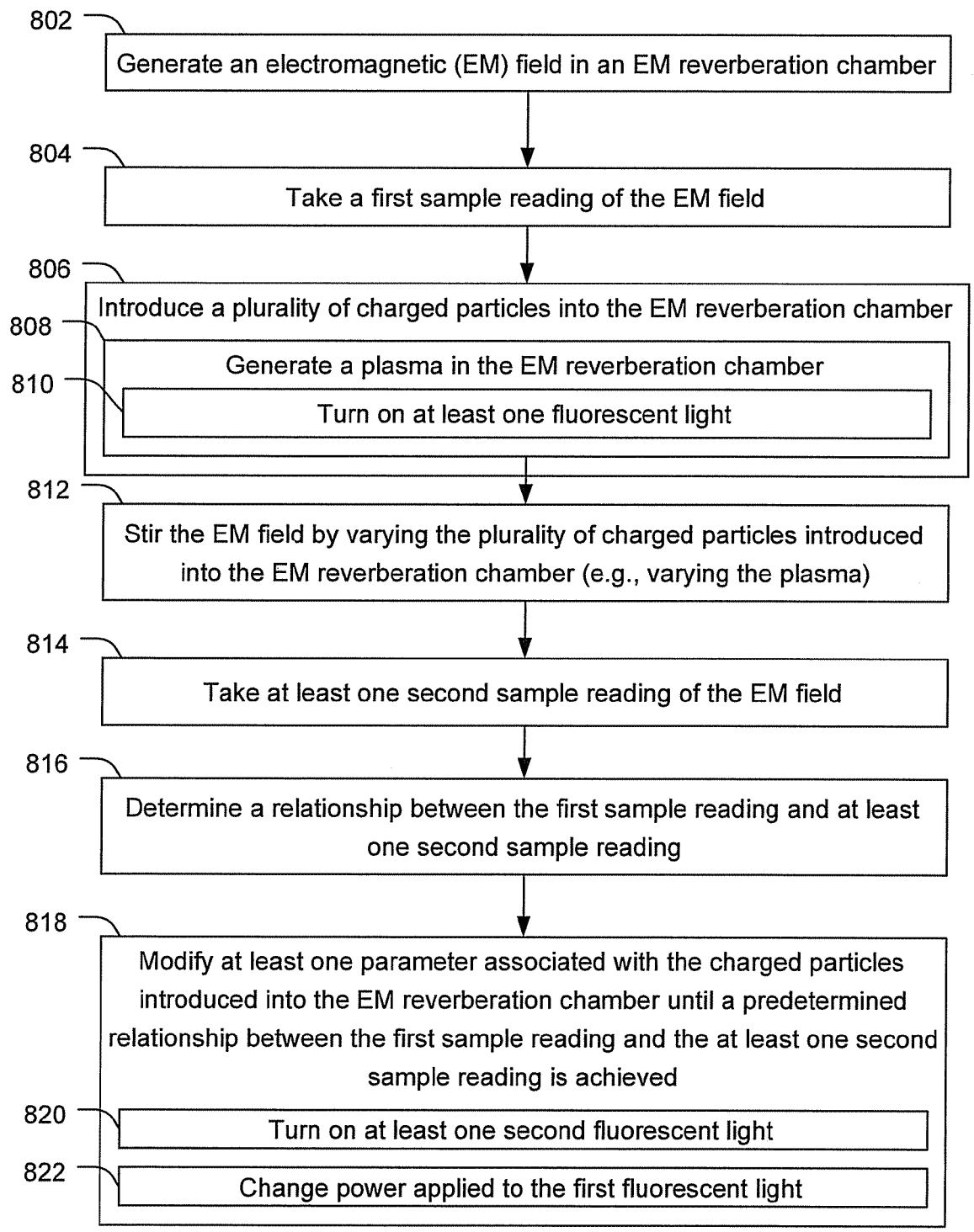
FIG. 8 is a flow diagram of a second particular embodiment of a method of stirring an EM field of an EM reverberation chamber.

FIG. 8 is a flow diagram of a second particular embodiment of a method of stirring an EM field of an EM reverberation chamber. The method 800 includes, at 802, generating an electromagnetic (EM) field in an EM reverberation chamber. The method 800 may also include, at 804, taking a first sample reading of the EM field. For example, a network analyzer (such as the network analyzer 110 discussed with reference to FIGS. 1-4, or the network analyzer 510 discussed with reference to FIGS. 5 and 6) may be used to sample the EM field within the EM reverberation chamber.

In a particular embodiment, the method 800 includes, at 806, introducing a plurality of charged particles into the EM reverberation chamber. For example, the plurality of charged particles may be introduced by generating a plasma within the EM reverberation chamber, at 808. The plasma may be generated, at 810, by turning on at least one florescent light within the EM reverberation chamber.

The method 800 may also include, at 812, stirring the EM field by varying the plurality of charged particles introduced into the EM reverberation chamber. For example, the charged particles introduced into the EM reverberation chamber may be varied by varying the plasma generated in the EM reverberation chamber. The method may include, at 814, taking at least one second sample reading of the EM field. A network analyzer may be used to take the second sample reading(s) of the EM field within the EM reverberation chamber. The method may further include, at 816, determining a relationship between the first sample reading and the at least one second sample reading.

In a particular embodiment, the method includes, at 818, modifying at least one parameter associated with the charged particles introduced into the EM reverberation chamber until a pre-determined relationship between the first sample reading and the at least one second sample reading is achieved. For example, a statistical correlation of the first sample reading and the at least one second sample reading may be determined. When there is a statistical correlation between the first sample reading and the at least one second sample reading (e.g., when a correlation value related to the first sample reading and the at least one second sample reading satisfies a predetermined threshold), the EM field may be determined to not be stirred. However, when there is no statistical correlation between the first sample reading and the at least one second sample reading (e.g., when the correlation value related to the first sample reading and the at least one second sample reading fails to satisfy the predetermined threshold), the EM field may be determined to be stirred. To illustrate, modifying at least one parameter associated with the charged particles introduced into the EM reverberation chamber may include, at 820, turning on at least one second florescent light. In another example, modifying at least one parameter associated with the charged particles introduced into the EM reverberation chamber may include, at 822, changing a power level applied to the first florescent light.

Figure 9:
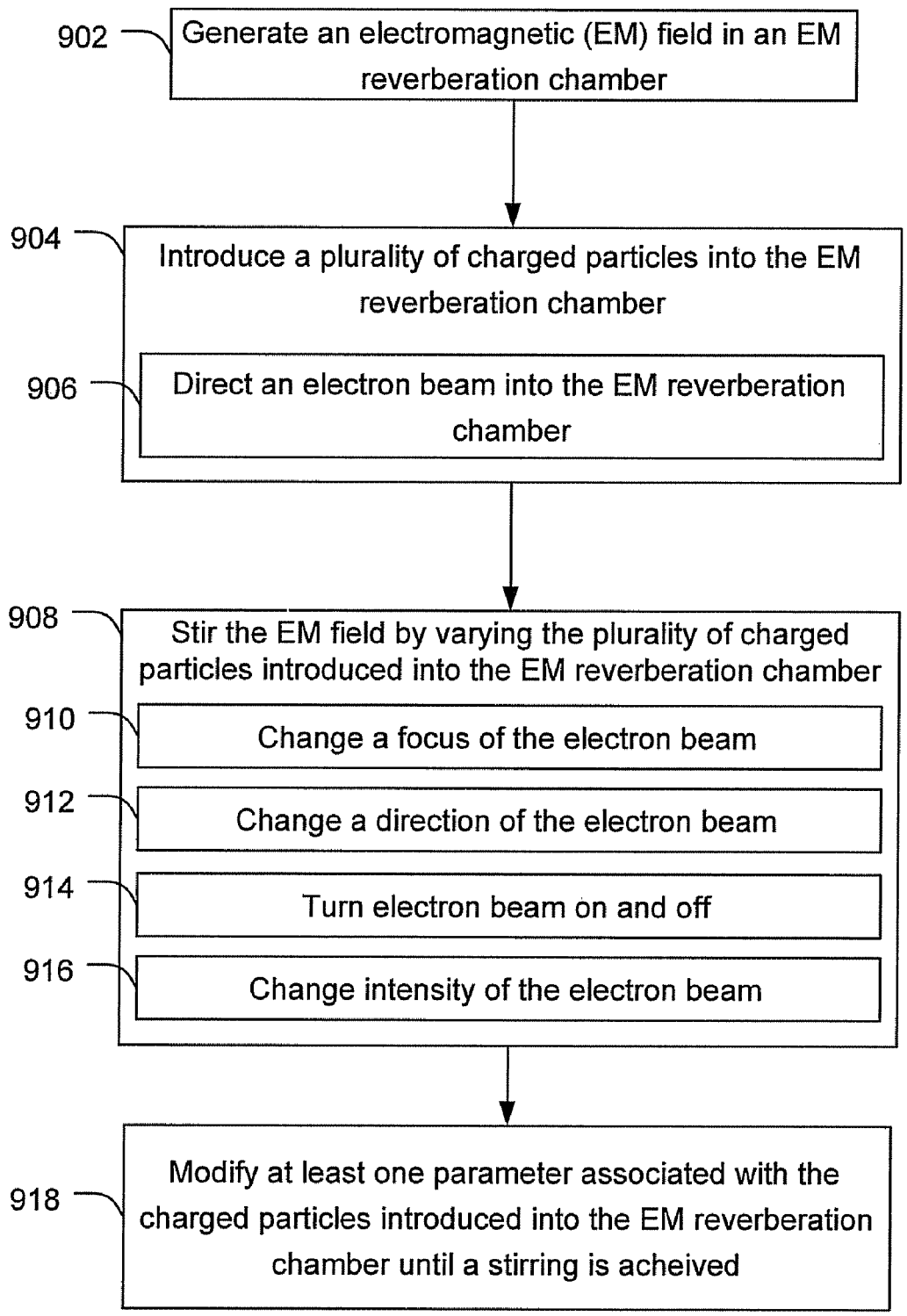
FIG. 9 is a flow diagram of a third particular embodiment of a method of stirring an EM field of an EM reverberation chamber.

FIG. 9 is a flow diagram of a third particular embodiment of a method of stirring an EM field of an EM reverberation chamber. The method 900 may include, at 902, generating an EM field in the EM reverberation chamber. The method 900 may also include, at 904, introducing a plurality of charged particles into the EM reverberation chamber. For example, introducing a plurality of charged particles into the EM reverberation chamber may include, at 906, directing an electron beam into the EM reverberation chamber.

In a particular embodiment, the method also includes, at 908, stirring the EM field by varying the plurality of charged particles introduced into the EM reverberation chamber. For example, the plurality of charged particles introduced into the EM reverberation chamber may be varied, at 910, by changing a focus of the electron beam. In another example, the plurality of charged particles introduced into the EM reverberation chamber may be varied, at 912, by changing a direction of the electron beam. In another example, the plurality of charged particles introduced into the EM reverberation chamber may be varied, at 914, by turning the electron beam on and off. For example, an electron beam gun may be cycled on and off or the electron beam may be shuttered or otherwise inhibited from entering the EM reverberation chamber to vary the introduction of the charged particles into the EM reverberation chamber. In another example, the plurality of charged particles introduced into the EM reverberation chamber may be varied, at 916, by changing an intensity of the electron beam. For example, the electron beam gun may be variable to increase or decrease the power of the electron beam, thereby changing the plurality of charged particles introduced into the EM reverberation chamber.

In a particular embodiment, the method includes, at 918, modifying at least one parameter associated with the charged particles introduced into the EM reverberation chamber until stirring is achieved. For example, a statistical correlation may be determined with respect to baseline readings taken before the charged particles are introduced into the EM reverberation chamber and one or more sample readings taken after the charged particles are introduced into the EM reverberation chamber. When there is a statistical correlation between the baseline readings and the one or more sample readings (e.g., when a correlation value related to the baseline readings and sample readings satisfies a predetermined threshold), the EM field may be determined to not be stirred. However, when there is no statistical correlation between the baseline readings and the one or more sample readings (e.g., when the correlation value related to the baseline readings and the sample readings fails to satisfy the predetermined threshold), the EM field may be determined to be stirred. When stirring is not achieved, the charged particles introduced into the EM reverberation chamber may be varied and another statistical correlation may be determined. Thus, the method may continue iteratively in this manner until stirring is achieved.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, claimed subject matter may be directed to less than all of the features of any of the disclosed embodiments. Thus, the following claims are incorporated into the Detailed Description, with each claim standing on its own as defining separately claimed subject matter.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A method, comprising:
   generating an electromagnetic (EM) field in an EM reverberation chamber;
   introducing a plurality of charged particles into the EM reverberation chamber; and
   stirring the EM field by varying the plurality of charged particles introduced into the EM reverberation chamber.

2. The method of claim 1, wherein introducing the plurality of charged particles into the EM reverberation chamber includes directing an electron beam into the EM reverberation chamber.

3. The method of claim 2, wherein varying the plurality of charged particles introduced into the EM reverberation chamber includes changing a focus of the electron beam.

4. The method of claim 2, wherein varying the plurality of charged particles introduced into the EM reverberation chamber includes changing a direction of the electron beam.

5. The method of claim 1, wherein introducing the plurality of charged particles into the EM reverberation chamber includes generating a plasma in the EM reverberation chamber.

6. The method of claim 5, wherein generating the plasma includes turning on at least one first fluorescent light.

7. The method of claim 6, wherein varying the plurality of charged particles introduced into the EM reverberation chamber includes turning on at least one second fluorescent light.

8. The method of claim 1, wherein varying the plurality of charged particles introduced into the EM reverberation chamber includes changing a location of the charged particles within the EM reverberation chamber.

9. The method of claim 1, wherein varying the plurality of charged particles introduced into the EM reverberation chamber includes changing an intensity measure associated with the charged particles within the EM reverberation chamber.

10. The method of claim 1, wherein varying the plurality of charged particles introduced into the EM reverberation chamber includes changing a distribution of the charged particles within the EM reverberation chamber.

11. The method of claim 1, wherein varying the plurality of charged particles introduced into the EM reverberation chamber includes changing a density of the charged particles within the EM reverberation chamber.

12. The method of claim 1, further comprising:
    taking a first sample reading of the EM field before introducing the plurality of charged particles into the EM reverberation chamber;
    taking at least one second sample reading of the EM field after introducing the plurality of charged particles into the EM reverberation chamber; and
    determining a relationship between the first sample reading and the at least one second sample reading;
    wherein varying the plurality of charged particles introduced into the EM reverberation chamber includes modifying a parameter associated with the plurality of charged particles until a predetermined relationship between the first sample reading and the at least one second sample reading is achieved.

13. A system, comprising:
    an electromagnetic (EM) reverberation chamber;
    a transmit antenna and a receive antenna operable to generate an EM field within the EM reverberation chamber; and
    a variable charged particle source to stir the EM field by varying introduction of charged particles into the EM field.

14. The system of claim 13, further comprising a network analyzer responsive to the transmit antenna and the receive antenna, the network analyzer to take readings of the EM field.

15. The system of claim 13, further comprising a processor to perform statistical analysis of the readings taken by the network analyzer to determine when the EM field is stirred.

16. The system of claim 13, wherein the variable charged particle source includes an electron beam gun.

17. The system of claim 16, further comprising a charged plate to change a direction of an electron beam generated by the electron beam gun to vary a distribution of the charged particles within the EM reverberation chamber.

18. The system of claim 13, wherein the variable charged particle source includes at least one fluorescent light.

19. The system of claim 13, wherein the variable charged particle source includes a fluorescent light array, and wherein the variable charged particle source is varied by changing a pattern of lights of the fluorescent light array that are powered.

20. The system of claim 19, further comprising:
    a network analyzer to take readings of the EM field; and
    a processor to perform statistical analysis of readings taken by the network analyzer to determine when the EM field is stirred by alternately analyzing the EM field and powering at least one light of the fluorescent light array until the analysis indicates that the EM field is stirred.

* * * * *